United States Patent
Han et al.

(10) Patent No.: US 8,505,559 B2
(45) Date of Patent: Aug. 13, 2013

(54) CLEANING APPARATUS AND HIGH PRESSURE CLEANER FOR USE THEREIN

(75) Inventors: Gap Su Han, Yongin (KR); Ki Pung Yoo, Seoul (KR); Jong Sung Lim, Seoul (KR); Young Hoon Kwon, Seoul (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 0 days.

(21) Appl. No.: 12/838,941

(22) Filed: Jul. 19, 2010

(65) Prior Publication Data

US 2011/0120507 A1 May 26, 2011

Related U.S. Application Data

(62) Division of application No. 11/499,546, filed on Aug. 4, 2006, now abandoned.

(30) Foreign Application Priority Data

Jan. 21, 2006 (KR) .................. 10-2006-0006590

(51) Int. Cl.
*B08B 3/00* (2006.01)
(52) U.S. Cl.
USPC ..... 134/94.1; 134/95.1; 134/99.2; 134/100.1; 134/102.2; 134/902

(58) Field of Classification Search
USPC ............. 134/56 R, 94.1, 95.1, 99.2, 100.1, 134/102.1, 102.2, 105, 902
See application file for complete search history.

(56) References Cited

U.S. PATENT DOCUMENTS

| | | | | |
|---|---|---|---|---|
| 4,542,114 | A | * | 9/1985 | Hegarty ................... 502/39 |
| 6,184,972 | B1 | | 2/2001 | Mizutani et al. |
| 6,558,475 | B1 | * | 5/2003 | Jur et al. ................. 134/21 |
| 6,846,380 | B2 | | 1/2005 | Dickinson et al. |
| 6,871,656 | B2 | * | 3/2005 | Mullee ................ 134/103.1 |
| 6,892,741 | B2 | * | 5/2005 | Jur et al. ................ 134/105 |
| 6,953,042 | B2 | * | 10/2005 | Jur et al. ............... 134/56 R |
| 6,962,629 | B2 | * | 11/2005 | Johnson et al. ............ 134/13 |
| 2001/0029971 | A1 | | 10/2001 | Farmer et al. |
| 2002/0104751 | A1 | | 8/2002 | Drewery et al. |
| 2003/0047199 | A1 | | 3/2003 | Worm |
| 2003/0161780 | A1 | * | 8/2003 | Howard et al. .......... 423/437.1 |
| 2004/0003831 | A1 | | 1/2004 | Mount |
| 2005/0005957 | A1 | | 1/2005 | Yamagata et al. |

* cited by examiner

*Primary Examiner* — Michael Kornakov
*Assistant Examiner* — Benjamin L Osterhout
(74) *Attorney, Agent, or Firm* — Frommer Lawrence & Haug LLP; Ronald R. Santucci

(57) ABSTRACT

A cleaning apparatus in which a cleaning process is simplified, a time required for the cleaning process is reduced and which has an excellent cleaning effect, and a high pressure cleaner for use therein are provided.

9 Claims, 15 Drawing Sheets

FIG. 8
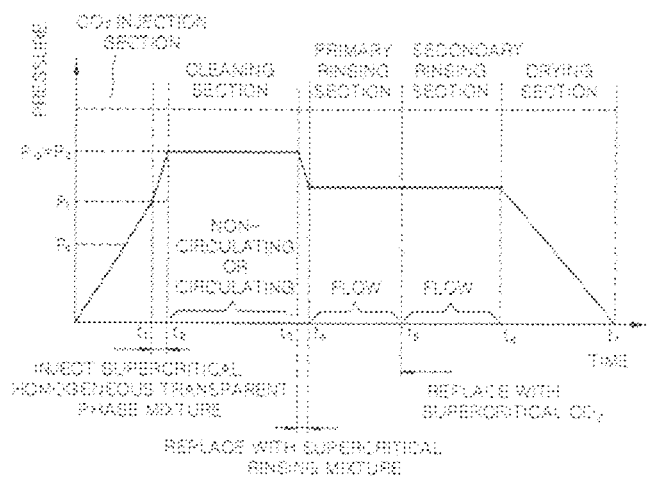
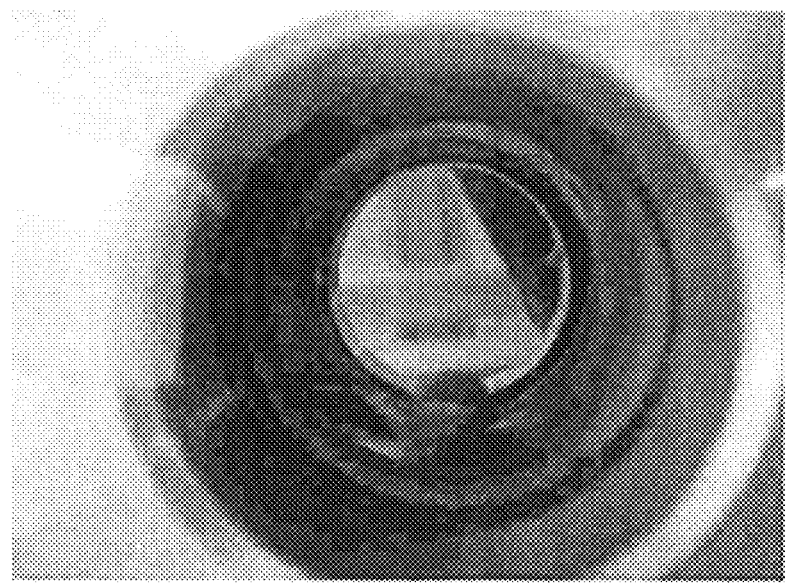
FIG. 9

CLEANING APPARATUS AND HIGH PRESSURE CLEANER FOR USE THEREIN

CROSS-REFERENCE TO RELATED PATENT APPLICATIONS

This application is a division of U.S. patent application Ser. No. 11/499,546 filed Aug. 4, 2006 entitled "Cleaning Apparatus and High Pressure Cleaner for Use Therein and claims priority to Korean Patent Application No. 10-2006-0006590, filed on Jan. 21, 2006, in the Korean Intellectual Property Office, the disclosures of which are incorporated herein by reference.

BACKGROUND OF THE INVENTION

1. Field of the Invention

The present invention relates to a cleaning apparatus and a high pressure cleaner for use therein, and more particularly, to a cleaning apparatus in which a cleaning process is simplified and a time required for the cleaning process is reduced. The apparatus has an excellent cleaning effect and a high pressure cleaner for use therein.

2. Description of the Related Art

In a semiconductor wafer manufacturing process, a photoresist (PR) layer should be formed on a semiconductor substrate and removed after a predetermined process. The process of removing the photoresist (PR) layer is referred to as a cleaning process. The cleaning process can be performed after a variety of operations of the semiconductor wafer manufacturing process, such as a front end of the line (FEOL) operation, a back end of the line (BEOL) operation or ion implantation. The cleaning process is a process in which contaminants, such as a photoresist or photoresist residues, are removed from a surface of a substrate in a ultra-fine pattern. To this end, a wet cleaning process using water and various solvents and a dry cleaning process using supercritical carbon dioxide ($CO_2$) have been developed.

In a conventional wet cleaning method including an RCA method, a cleaning process can be properly performed for purposes. However, many problems exist in that the conventional wet cleaning method is not suitable for manufacture of an ultra large scale integrated circuit (ULSI). For example, in a wet cleaning process, wettability of cleaning fluid to a fine structure having a high aspect ratio is lowered, and due to repeated rinsing and drying processes, unwanted particles are generated. In addition, there are problems concerning metal inadvertently contaminated by a liquid-phase chemical solution, water marks and corrosion, costs for ultra-pure purification and high purity purification of chemicals. Process equipment clusterization is not easily performed because of the large size of equipment and complicated process. In addition, there are problems with environmental contamination caused by waste water and waste fluid and costs for treating waste water.

In addition, since a large quantity of chemical solvent is used in a conventional RCA cleaning method, problems exist in that a wafer may be damaged and a photoresist layer may not be completely removed. To address the problems, new solvent has been developed. However, in the conventional wet cleaning process, due to a characteristic of the molecular structure of cleaning fluid, molecules of the cleaning fluid cannot easily infiltrate an ultra-fine structure less than 65 nm. In particular, it is not easy to clean copper for manufacturing a high performance semiconductor in a next generation fine pattern having a low-K dielectric layer material.

To address the problems, the development of plasma, gaseous or supercritical dry cleaning technology is needed. However, when a photoresist is removed using an oxygen plasma ashing method used in a dry cleaning process, a wafer is damaged and contaminated by oxygen plasma, and due to the existence of contaminants, an additional wet cleaning process needs to be performed. In addition, damages due to a wet method or a plasma dry cleaning process do not occur in a cleaning process using the oxidation action of ozone that has been recently developed. However, problems such as environmental contamination caused by ozone exist.

During semiconductor manufacture, processes such as dry etching or wet etching, ashing or ion implantation are performed, and photoresist may remain on a wafer. Accordingly, conventionally, a partial drying process and a wet process, that is, two processes such as ashing and organic strip processes, are performed to remove the photoresist and thus, the number of processes is increased, resources are consumed and numerous costs for waste water treatment are needed.

In addition, when wet cleaning is accompanied as described above, an additional drying process, such as spin drying, isopropyl alcohol (IPA) vapor drying, or marangoni drying, is needed. In these drying methods, water marks are left and strain is generated and the possibility of recontamination caused by an electrostatic force is high. In particular, in the case of IPA vapor drying, a high temperature (greater than 200° C.) for IPA vaporization should be maintained and a large amount of IPA is required.

A semiconductor wafer cleaning method using a supercritical process in which supercritical $CO_2$ and several common solvent are mixed has been already introduced. However, because a homogeneous transparent phase cannot be formed by simply mixing polar common solvent with supercritical nonpolar $CO_2$, problems concerning the conventional wet cleaning process are not solved and cleaning efficiency is low. Even though a homogeneous transparent phase supercritical state is formed, a temperature greater than 100° C. and a pressure greater than 300 bar are needed and thus, costs are increased. To address these problems, even when a surfactant is introduced, an additional mixer or a ultrasonic device is needed so as to form a supercritical homogeneous transparent phase and thus, manufacturing time is increased.

In addition, high purity (greater than 99.99%) $CO_2$ is used to manufacture a semiconductor. In the prior art, an efficient purification process of purifying and recovering used $CO_2$ to reuse $CO_2$ cannot be performed.

SUMMARY OF THE INVENTION

The present invention provides a cleaning apparatus in which a cleaning process is simplified and a time required for the cleaning process is reduced. The apparatus has an excellent cleaning effect and a high pressure cleaner for use therein.

According to an aspect of the present invention, there is provided a cleaning apparatus comprising: a liquid carbon dioxide ($CO_2$) supply source and a gaseous $CO_2$ supply source; a high pressure pump changing $CO_2$ supplied from the liquid $CO_2$ supply source to $CO_2$ having high pressure; a cleaning additive supply source and a rinsing additive supply source; a homogeneous transparent phase mixer forming a supercritical homogeneous transparent phase mixture by mixing a cleaning additive supplied from the cleaning additive supply source and supercritical $CO_2$ supplied from the liquid $CO_2$ supply source, or forming a supercritical rinsing mixture by mixing a rinsing additive supplied from the rinsing additive supply source and supercritical $CO_2$ supplied from the liquid $CO_2$ supply source; a high pressure cleaner cleaning using the supercritical homogeneous transparent phase mixture supplied from the homogeneous transparent phase mixer and performing rinsing using the supercritical rinsing mixture supplied from the homogeneous transparent phase mixer; a separator separating gaseous $CO_2$ from a mixture discharged from the high pressure cleaner; and a $CO_2$ condenser condensing the separated $CO_2$.

The cleaning apparatus may further comprise at least one of a cleaning column and an adsorption column for purifying $CO_2$ separated by the separator.

$CO_2$ condensed in the $CO_2$ condenser may be provided to the liquid $CO_2$ supply source and may be re-used.

The cleaning apparatus may further comprise a heater heating $CO_2$ supplied from the liquid $CO_2$ supply source, the cleaning additive supplied from the cleaning additive supply source, and the rinsing additive supplied from the rinsing additive supply source.

The homogeneous transparent phase mixer may form the supercritical homogeneous transparent phase mixture by mixing the cleaning additive supplied having atmospheric pressure or a low pressure less than 10 bar with the supercritical $CO_2$ having high pressure of 120 to 300 bar, using a large pressure difference therebetween.

The cleaning apparatus may further comprise a pressure regulating valve connected to the high pressure cleaner and regulating pressure inside the high pressure cleaner.

The cleaning apparatus may further comprise: a circulation line connecting an outlet of the high pressure cleaner to a middle point between the high pressure cleaner and the homogeneous transparent phase mixer; and a circulation pump connected to the circulation line.

An internal or external circulation unit may be provided to the homogeneous transparent phase mixer.

According to another aspect of the present invention, there is provided a high pressure cleaner comprising: a wafer loading device on which a wafer to be cleaned is loaded and which includes a protrusion; an upper element including an inlet through which a mixture is injected in a downward direction, a wafer loading device fixing unit in which the protrusion of the wafer loading device is inserted and which enables the wafer loading device to be fixed therein, and a pneumatic cylinder insertion unit in which a pneumatic cylinder sliding from a side is inserted; an ascending and descending pneumatic cylinder moving the upper element in upward and downward directions; a lower element including a pneumatic cylinder insertion unit in which a pneumatic cylinder sliding from a side is inserted and an outlet through which a mixture is discharged and forming a space between the lower element and the upper element in which the wafer loading device can be disposed; and an adherent type pneumatic cylinder sliding into the pneumatic cylinder insertion unit of the upper element and the pneumatic cylinder insertion unit of the lower element and combining the upper element and the lower element when the upper element descends and is engaged with the lower element.

The high pressure cleaner may further comprise a sealant disposed between an edge of a surface of the upper element in a direction of the lower element and an edge of a surface of the lower element in a direction of the upper element and sealing a space between the upper element and the lower element from the outside.

The high pressure cleaner may further comprise a first bended portion disposed at an edge of a surface of the upper element in a direction of the lower element, and a second bended portion disposed at an edge of a surface of the lower element in a direction of the upper element, and a first sealant and a second sealant disposed in the first bended portion and the second bended portion, respectively.

A groove may be formed in a circumferential direction of the wafer loading device on a surface of the wafer loading device in a direction of the upper element, and a plurality of spray outlets may be provided along the groove.

The inlet of the upper element may be provided so that a material injected through the inlet of the upper element is injected in a direction of the groove of the wafer loading device.

The upper element may further comprise an upper element guide pin and the lower element may further comprise a guide pin insertion portion in which the upper element guide pin is inserted.

The inlet and the outlet may be provided in opposite directions.

The high pressure cleaner may further comprise a heating source and a cooling source controlling temperature of the high pressure cleaner.

BRIEF DESCRIPTION OF THE DRAWINGS

The above and other features and advantages of the present invention will become more apparent by describing in detail exemplary embodiments thereof with reference to the attached drawings in which:

FIG. 8 is a graph of time versus pressure with respect to all sections of a cleaning process using the cleaning apparatus illustrated in FIG. 2;

FIG. 9 is a photo of a supercritical homogeneous transparent phase mixture used in a supercritical cleaning process;

DETAILED DESCRIPTION OF THE INVENTION

The present invention will now be described more fully with reference to the accompanying drawings, in which exemplary embodiments of the invention are shown.

Figure 1:
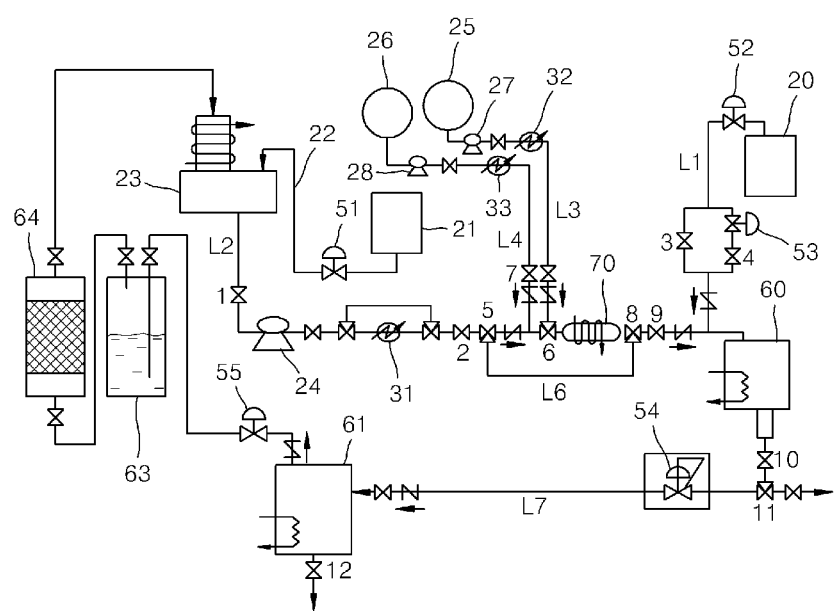
FIG. 1 is a schematic view of a cleaning apparatus used in a cleaning process according to an embodiment of the present invention.

FIG. 1 is a schematic view of a cleaning apparatus used in a cleaning process according to an embodiment of the present invention. Referring to FIG. 1, the cleaning apparatus includes a high pressure cleaner 60, a gaseous carbon dioxide ($CO_2$) supply source 20 and a liquid $CO_2$ supply source 21 which are connected to the high pressure cleaner 60, a high pressure pump 24 for supplying high pressure $CO_2$, a cleaning additive supply source 25 for supplying an additive for cleaning and a rinsing additive supply source 26 for supplying an additive for rinsing, heaters 31, 32, and 33 installed on supply lines L2, L3, and L4, respectively, to heat $CO_2$ and additives, a homogeneous transparent phase mixer 70 for supplying a predetermined amount of cleaning additive while forming a supercritical homogeneous transparent phase mixture, a pressure regulating valve 54 connected to the high pressure cleaner 60 to maintain a predetermined pressure, a separator 61 connected to the high pressure cleaner 60 to separate gaseous $CO_2$ and a liquid-phase additive from a mixture discharged from the high pressure cleaner 60, a gas scrubbing column 63 and an adsorption column 64 for purifying the separated gaseous $CO_2$, a $CO_2$ condenser 23 for condensing and reusing the purified gas, a heating medium, a coolant supplier, and on-off automatic valves 1 to 12.

A supercritical state is a state existing at a point greater than a critical temperature and a critical pressure. Properties of a supercritical fluid are very different from those of a fluid in a normal state. That is, properties of the supercritical fluid, such as density of a fluid, viscosity, solubility, thermal capacity or dielectric constant, vary rapidly. The supercritical fluid state is a state existing at a point greater than the critical temperature and the critical pressure. The critical temperature is temperature at which gas is not liquefied even though pressure is increased, and the critical pressure is pressure at which liquid is not vaporized even though temperature is raised. For example, the critical temperature of $CO_2$ is about 31.06° C. and the critical pressure of $CO_2$ is about 73.8 bar. The supercritical fluid is a fluid in which a gaseous state and a liquid state cannot be discriminated from each other. The supercritical fluid has a similar characteristic to that of a liquid in that it has large solubility. In addition, the supercritical fluid has similar characteristics to that of a gas in that it has low viscosity, large diffusivity, and low surface tension and can easily infiltrate a fine structure.

The gaseous $CO_2$ supply source 20 and the liquid $CO_2$ supply source 21 are connected to the high pressure cleaner 60 via supply lines L1 and L2. The cleaning additive supply source 25 and the rinsing additive supply source 26 are connected to the supply line L3 and supply a cleaning additive and a rinsing additive to the homogeneous transparent phase mixer 70 via a cleaning additive supply pump 27 and a rinsing additive supply pump 28. The homogeneous transparent phase mixer 70 connected to the high pressure cleaner 60 forms a supercritical homogeneous transparent phase mixture by mixing the cleaning additive having atmospheric pressure or a low pressure state with the supercritical $CO_2$ by using a large pressure difference therebetween. In addition, the homogeneous transparent phase mixer 70 may form a supercritical rinsing mixture by mixing the rinsing additive and the supercritical $CO_2$, and a process thereof will be described later.

Figure 2:
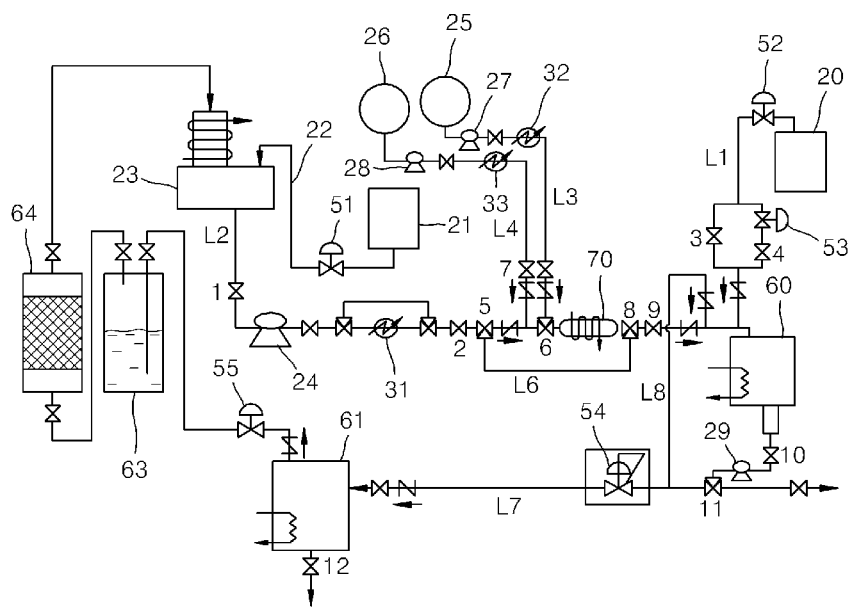
FIG. 2 is a schematic view of a cleaning apparatus used in a cleaning process according to another embodiment of the present invention.

The cleaning apparatus of FIG. 1 may further include a circulation line L8 and a circulation pump 29, as illustrated in FIG. 2 which is a schematic view of a cleaning apparatus used in a cleaning process according to another embodiment of the present invention. The circulation line L8 and the circulation pump 29 are connected to the homogeneous transparent phase mixer 70. The circulation line L8 and the circulation pump 29 enable the supplied supercritical homogeneous transparent phase mixture to be stabilized by formation of an external circulation flow of the high pressure cleaner 60 and a mixing effect and a heat exchanging effect to be improved.

A cleaning process performed using the cleaning apparatus will now be described in detail.

First, a wafer is loaded in the high pressure cleaner 60, which will be described later below.

If the wafer is loaded in the high pressure cleaner 60, high-purity gaseous $CO_2$ (greater than 99.99%) having low pressure (less than 20 psig) by the pressure regulators 52 and 53 is injected into the high pressure cleaner 60 via the corresponding on-off automatic valves 3 and 4 and the supply line L1 from the gaseous $CO_2$ supply source 20. This causes fine contaminants inside the high pressure cleaner 60 to be removed. If the high pressure cleaner 60 is sealed (a process thereof will be described later), high-purity gaseous $CO_2$ having high pressure (about 30-50 bar) is injected into the high pressure cleaner 60. This causes a mixed fluid to smoothly flow into the high pressure cleaner 60, which will be described later.

The cleaning additive and the supercritical $CO_2$ having higher pressure than a supercritical cleaning pressure (pressure in a cleaning process in the high pressure cleaner 60 is, preferably, about 120-300 bar) is injected into the homogeneous transparent phase mixer 70, which will be described later. The supercritical $CO_2$ is supplied from the $CO_2$ condenser 23. That is, the supercritical $CO_2$ is automatically supplied from the $CO_2$ condenser 23 by opening and closing the on-off automatic valves 1, 2, 5, and 8 installed on the supply line L2 and via the high pressure pump 24 for supplying $CO_2$. The supercritical $CO_2$ may be heated by the heater 31 to become the supercritical $CO_2$, before it reaches the homogeneous transparent phase mixer 70.

The gaseous $CO_2$ supplied from the gas scrubbing column 63 and the adsorption column 64 is condensed using a refrigerant in the $CO_2$ condenser 23 and thus, the supercritical $CO_2$ is formed. At this time, initial liquid $CO_2$ and $CO_2$ corresponding to wasted $CO_2$ in a cleaning process are supplied from the liquid $CO_2$ supply source 21 via the liquid $CO_2$ supplementing valve 51.

The supercritical $CO_2$ is mixed with the cleaning additive and becomes a supercritical homogeneous transparent phase mixture for use in a cleaning process in the sealed high pressure cleaner 60. In addition, the supercritical $CO_2$ is mixed with the rinsing additive and becomes a supercritical rinsing mixture for use in the cleaning process in the sealed high pressure cleaner 60.

The additives are automatically supplied from the cleaning additive supply source 25 and the rinsing additive supply source 26 via the on-off automatic valves 6 and 7 installed on the supply lines L3 and L4 and the quantity regulating supply lines.

In this case, the supplied $CO_2$ and the additives are heated by the heaters 31, 32, and 33 installed on the supply lines L2, L3, and L4, respectively, or by a line heater at a predetermined temperature or temperature in a predetermined range (for example, about 35-100° C.). The cleaning additive is instantaneously mixed by the homogeneous transparent phase mixer 70 with the supercritical $CO_2$ at a large pressure difference and becomes a supercritical homogeneous transparent phase mixture flowing into the high pressure cleaner 60 and used in the cleaning process. More specifically, the cleaning additive having atmospheric pressure or a low pressure less than 10 bar is supplied to the homogeneous transparent phase mixer 70 and then, the $CO_2$ having a higher pressure than the supercritical cleaning pressure is supplied to the homogeneous transparent phase mixer 70 so that the supercritical homogeneous transparent phase mixture can be formed using a mixing effect caused by a large pressure difference.

In general, since the supercritical $CO_2$ is nonpolar and the cleaning additive is polar, a higher super-high temperature and pressure than that used in the above-described conditions are needed to mix the supercritical $CO_2$ and the cleaning additive. As such, cleaning costs are greatly increased. Accordingly, to address these problems, in the cleaning process according to the present embodiment, the cleaning additive further includes a surfactant so that the supercritical homogeneous transparent phase mixture can be easily formed under the above-described cleaning conditions such as super-high pressure and super-high temperature. In addition, the cleaning additive and the supercritical $CO_2$ are mixed with each other using a large pressure difference in the homogeneous transparent phase mixer 70 so that the supercritical homogeneous transparent phase mixture can be easily formed within a short time without using an additional mixer or an ultrasonic device.

To this end, the cleaning additive may include a fluoride group surfactant. The fluoride group surfactant may use fluoride group carboxylic acid having a carbon number 2 to 20, perfluoro ether polymer having an average molecular weight of 300 to 5000 or a mixture thereof.

The composition of the cleaning additive will now be described in greater detail. The cleaning additive may include fluorosurfactant 0.01 to 90 wt %, aliphatic amine 0.01 to 15 wt %, polar organic solvent 0.01 to 15 wt %, alcohol-based solvent 0.1 to 20 wt %, ether-based solvent 0.1 to 30 wt %, anticorrosive agent 0 to 5 wt %, and water 0 to 15 wt %. In the present embodiment, the fluorosurfactant is fluoride group carboxylic acid having a carbon number of 2 to 20, perfluoro ether system polymer having an average molecular weight of 300 to 5000 or a mixture thereof. The aliphatic amine is monoethanolamine, 2-(2-aminoethoxy)ethanol, diethanolamine, amino bis propylamine, 2-methylaminoethanol, triethylaminoethanol or a mixture thereof. The polar organic solvent is N,N'-dimethylacetamide, dimethylsulfuroxide, 1-methyl-2-pyrrolidinone, N,N'-dimethylformamide, ammonium fluoride or a mixture thereof. The alcohol-based solvent is methanol, ethanol, isopropanol or a mixture thereof. The ether-based solvent is ethyleneglycol methylether, ethyleneglycol ethylether, ethyleneglycol butylether, diethyleneglycol methylether, diethylenglycol ethylether, triethyleneglycol methylether, triethyleneglycol ethylether or a mixture thereof. The anticorrosive agent is catechol, gallic acid or a mixture thereof.

Of course, a cleaning additive having a different composition from the composition described above may be used. For example, the cleaning additive may include fluorosurfactant 0 to 90 wt %, semiconductor cleaning stripper 0.1 to 15 wt %, alcohol-based solvent 0.1 to 20 wt %, and water 0 to 15 wt %. In this case, the fluorosurfactant is fluoride group carboxylic acid having a carbon number of 2 to 20, perfluoro ether system polymer having an average molecular weight of 300 to 5000 or a mixture thereof. The alcohol-based solvent is methanol, ethanol, isopropanol or a mixture thereof.

The volume of the cleaning additive in the supercritical homogeneous transparent phase mixture in which the cleaning additive and the supercritical $CO_2$ are mixed may be 2 to 30 percent by volume.

The homogeneous transparent phase mixer 70 for forming the supercritical homogeneous transparent phase mixture by mixing the cleaning additive and the supercritical $CO_2$ is a high pressure vessel like a high pressure cylinder, and so on. In this case, a heating source may be attached to the homogeneous transparent phase mixer 70 and the homogeneous transparent phase mixer 70 may be adjusted to a predetermined temperature or to a temperature in a predetermined range. A minimum space is provided in which the fixed quantity of the cleaning additive needed for cleaning can be supplied, the cleaning additive can be mixed with the supercritical $CO_2$ and the supercritical homogeneous transparent phase mixture can be formed. In addition, if necessary, an internal or external circulation unit may be further provided in the homogeneous transparent phase mixer 70 so as to maximize a mixing effect and a heat exchanging effect.

If the supercritical homogeneous transparent phase mixture is directly injected into the high pressure cleaner 60, due to a large pressure difference, the supercritical homogeneous transparent phase mixture is not maintained and is deformed. In order to prevent this problem, before the supercritical homogeneous transparent phase mixture is injected into the high pressure cleaner 60, $CO_2$ having a lower pressure than a supercritical cleaning pressure is injected into the high pressure cleaner 60 via an auxiliary line L6 using 3-way on-off automatic valves 5 and 8 on the supply line L2. At this time, the pressure in the high pressure cleaner 60 is regulated to a predetermined pressure or to a pressure in a predetermined range (for example, pressure less than 10 to 40 bar of the supercritical cleaning pressure) using the pressure regulating valve 54.

Before the supercritical homogeneous transparent phase mixture is injected into the high pressure cleaner 60, $CO_2$ having a lower pressure than the supercritical cleaning pressure is injected into the high pressure cleaner 60 such that the supercritical homogeneous transparent phase mixture is not deformed and is maintained and cleaning can be effectively performed. In this case, $CO_2$ is injected into the high pressure cleaner 60 at pressure lower than the supercritical cleaning pressure so that due to a pressure difference, the supercritical homogeneous transparent phase mixture can be naturally injected into the high pressure cleaner 60.

The supercritical homogeneous transparent phase mixture as described above is injected into the high pressure cleaner 60 in which the supercritical $CO_2$ is charged and can be used in a non-circulating state in a cleaning process without an additional device. Unlike FIG. 1, an external circulation flow is formed using the circulation line L8 and the circulation pump 29 and a cleaning operation is performed so that the homogeneous transparent phase mixture supplied to the high pressure cleaner 60 can be stably maintained and a mixing effect and a heat exchanging effect can be improved.

If a photoresist or etch residues on the wafer are removed using the cleaning operation, the cleaning additive and cleaning contaminants such as a solvated photoresist residues need not to remain in the surface of the wafer. To this end, the homogeneous transparent phase mixer 60 mixes the rinsing additive supplied from the rinsing additive supply source 26 and the supercritical $CO_2$ so that a supercritical rinsing mixture can be formed and injected into the high pressure cleaner 60 and a cleaning mixture is removed. The supercritical rinsing mixture containing the supercritical $CO_2$ and the mainly alcohol-based rinsing additive can be formed by simple mixture of the rinsing additive and the supercritical $CO_2$. The rinsing process may be performed using the supercritical rinsing mixture having pressure of about 80 to 250 bar.

Then, the cleaning additive mixture that may exist on the surface of the wafer can be removed using only the supercritical $CO_2$.

Gaseous $CO_2$ and a liquid-phase additive are separated by the separator 61 from the mixture discharged from the high pressure cleaner 60 after the cleaning and rinsing operations. At this time, pressure inside the high pressure cleaner 60 is reduced at a temperature of about 35° C. so that $CO_2$ is removed from the high pressure cleaner 60 in a gaseous state without phase transition to a liquid state. Unlike a conventional cleaning process, an additional drying device or operation is not required and problems such as formation of water marks that may occur after wet etching can be mostly prevented.

The separator 61 is used to separate a mixture in a high pressure state. A high pressure cleaning mixture (finally becoming high pressure $CO_2$) used in cleaning, rinsing, and dry operations is discharged into the separator 61 from the high pressure cleaner 60 using an automatic operation of the 3-way on-off automatic valve 11 and is purified and re-used. High-pressure gaseous $CO_2$ is finally discharged by changing a direction of the 3-way on-off automatic valve 11 and is separately treated.

The high pressure $CO_2$ separated from the separator 61 in an upward direction is transferred into the gas scrubbing column 63 via a back pressure regulator 55 attached to a connection line of an upper discharging portion of the separator 61 and the back pressure regulator 55 adjusting pressure. The liquid-phase additive separated from a lower portion of the separator 60 using an automatic operation of the on-off automatic valve 12 is purified and re-used via an additional treatment process or is discharged during general post-processing performed in an existing semiconductor manufacturing factory. In this case, a heating source is attached to the discharge line L7 and the separator 61 and latent heat loss caused by insulation expansion of the supercritical $CO_2$ or the liquid $CO_2$ is compensated for and discharge in a gaseous state is smoothly induced.

The gaseous $CO_2$ separated from the separator 61 goes through a purifying process. That is, the gaseous $CO_2$ moves toward the gas scrubbing column 63 via the back pressure regulator 55 and impurities of the gaseous $CO_2$ are primarily removed. The gaseous $CO_2$ moves toward the adsorption column 64 and impurities of the gaseous $CO_2$ are secondarily removed and it becomes high purity gaseous $CO_2$ (greater than 99.99%). Of course, only one of the gas scrubbing column 63 and the adsorption column 64 can be used. That is, purification can be performed simply using the adsorption column 64. Whether or not purification is performed simply using only the adsorption column 64 is determined depending on the components of an additive that can be changed according to the wafer to be cleaned or formation of a volatile gas caused by a cleaning reaction.

After the cleaning process is performed, the high purity gaseous $CO_2$ is condensed by the $CO_2$ condenser 23 into a liquid state using a circulation coolant system and re-circulated for another cleaning process.

According to the cleaning process according to an embodiment of the present invention, a conventional two-step process including a plasma ashing process (a drying process) and a wet process used in removing a photoresist or residues can be substituted for a one-step drying process using a supercritical homogeneous transparent phase mixture. In addition, the cleaning, rinsing, and drying processes are continuously performed in a single high pressure cleaner. Thus, an additional drying apparatus and process are not required. $CO_2$ that goes through pressurization and depression processes does not leave any residue because of phase change.

When only the supercritical $CO_2$ is used in the cleaning process, a cleaning effect is restricted. However, in the cleaning process according to the present embodiment, the cleaning process is performed by mixing the supercritical $CO_2$ and the cleaning additive so that the cleaning effect can be maximized. In this case, the supercritical $CO_2$ is nonpolar and the cleaning additive is generally polar. Thus, a higher super-high pressure and super-high temperature than those of the above-described conditions are required so that the supercritical $CO_2$ and the cleaning additive can be mixed and a supercritical state can be maintained. As such, cleaning costs are greatly increased. To address these problems, in the cleaning process according to the present embodiment, the cleaning additive includes the surfactant so that the supercritical homogeneous transparent phase mixture can be easily formed and maintained even under the above-described cleaning conditions. In this case, the cleaning additive and the supercritical $CO_2$ are mixed in the homogeneous transparent phase mixer 70 using a large pressure difference such that the supercritical homogeneous transparent phase mixture can be easily formed within a short time without using an additional mixer or an ultrasonic device.

The cleaning process according to the present embodiment is used so that the homogeneous transparent phase of the supercritical homogeneous transparent phase mixture can be easily formed and maintained within a short time and an automatic cleaning apparatus and an automatic valve are designed and configured and the cleaning process can be easily performed using process automation together with a control system.

In addition, a high diffusivity of the supercritical $CO_2$ is used so that the limit that semiconductor chemicals can infiltrate a fine structure is overcome, wettability of the fine structure is maximized using low surface tension and super fine cleaning required in forming and manufacturing patterns of a super fine structure can be performed accordingly.

In order to remove photoresist and residues using only pure supercritical $CO_2$ or the supercritical fluid mixture in which a homogeneous transparent phase is not easily formed, a combination of the cleaning additive including the surfactant presented in Table 1, which will be described later, can be used.

The structure of the high pressure cleaner 60 and cleaning inside the high pressure cleaner 60 will now be described.

Figure 3:
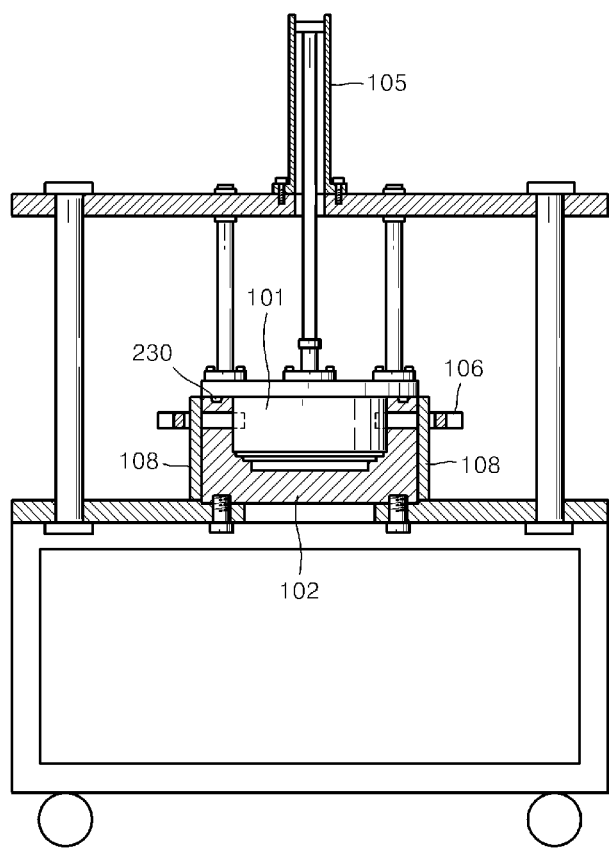
FIG. 3 is a front view of a high pressure cleaner included in the cleaning apparatus illustrated in FIG. 2.
Figure 4A:
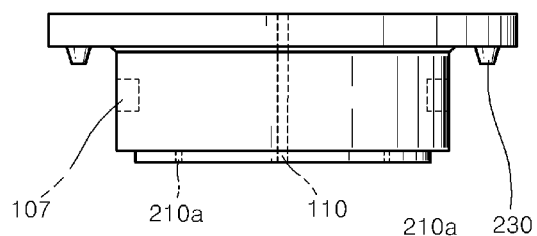
FIG. 4A is a front view of an upper element of the high pressure cleaner illustrated in FIG. 3.
Figure 4B:
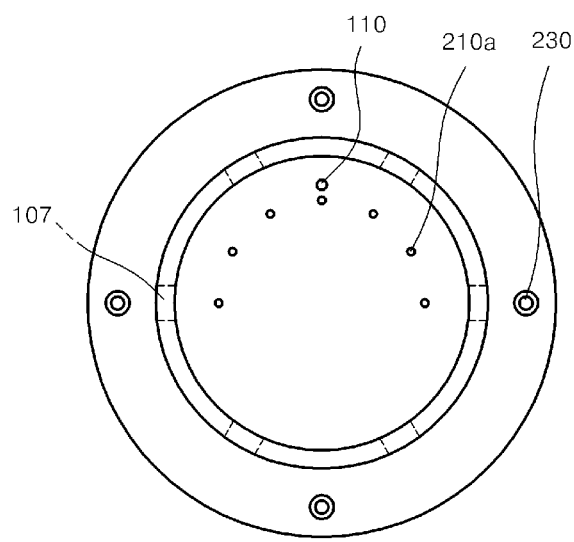
FIG. 4B is a bottom view of the upper element of the high pressure cleaner illustrated in FIG. 3.
Figure 5A:
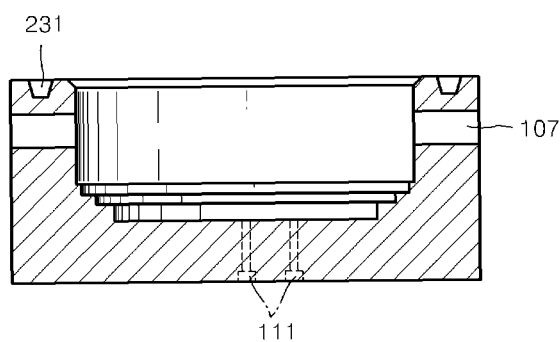
FIG. 5A is a cross-sectional view of a lower element of the high pressure cleaner illustrated in FIG. 3.
Figure 5B:
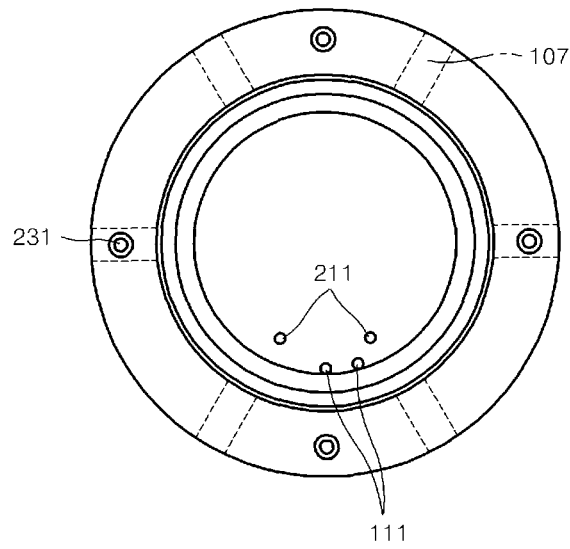
FIG. 5B is a plan view of the lower element of the high pressure cleaner illustrated in FIG. 3.
Figure 6A:
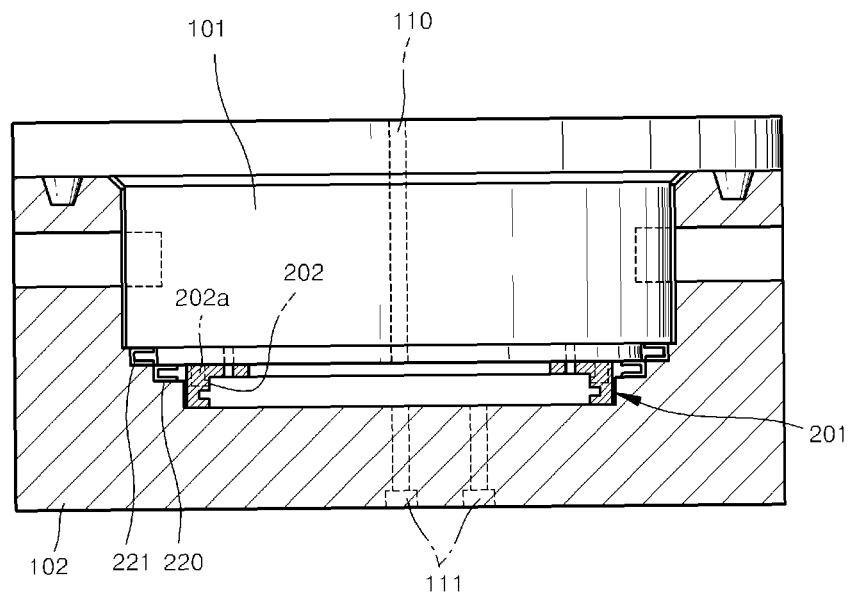
FIG. 6A is a schematic view of a combined structure of the upper element illustrated in FIG. 4A, the lower element illustrated in FIG. 5A and a wafer loading device.
Figure 6B:
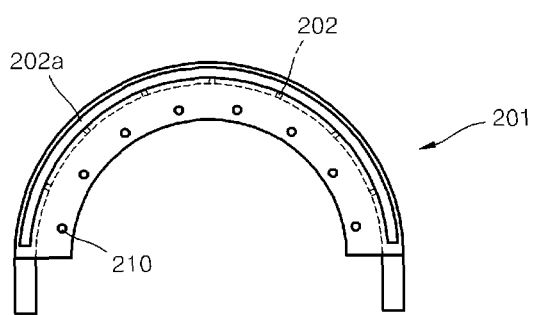
FIG. 6B is a plan view of a wafer loading device illustrated in FIG. 6A.
Figure 7A:
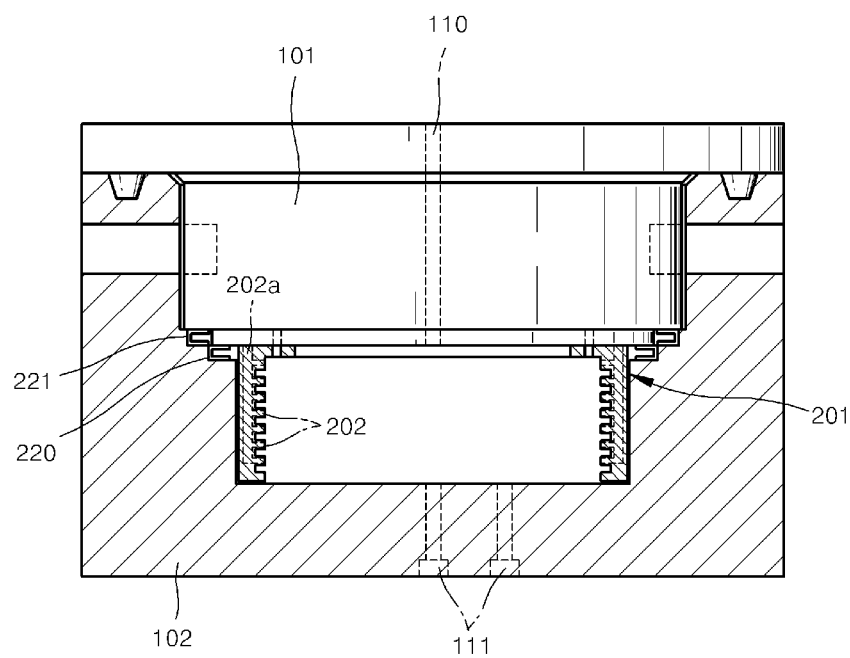
FIG. 7A is a front view of a modified example of FIG. 6A.
Figure 7B:
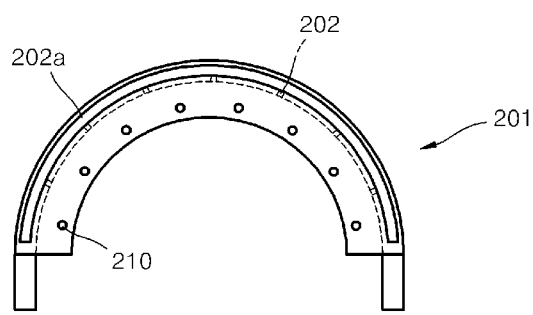
FIG. 7B is a plan view of the wafer loading device illustrated in FIG. 7A.

FIG. 3 is a front view of the high pressure cleaner 60 illustrated in FIGS. 1 and 2, FIG. 4A is a front view of an upper element of the high pressure cleaner 60 illustrated in FIG. 3, FIG. 4B is a bottom view of the upper element of the high pressure cleaner 60 illustrated in FIG. 3, FIG. 5A is a cross-sectional view of a lower element of the high pressure cleaner 60 illustrated in FIG. 3, and FIG. 5B is a plan view of the lower element of the high pressure cleaner 60 illustrated in FIG. 3. FIG. 6A is a schematic view of a combined structure of the upper element illustrated in FIG. 4A, wherein the lower element illustrated in FIG. 5A and a wafer loading device, FIG. 6B is a plan view of the wafer loading device illustrated in FIG. 6A, FIG. 7A is a view of a modified example of FIG. 6A, and FIG. 7B is a schematic plan view of the wafer loading device illustrated in FIG. 7A.

The high pressure cleaner 60 includes an upper element 101 and a lower element 102. The upper element 101 makes a vertical motion using an upper element-ascending and descending pneumatic cylinder 105. If the upper element 101 descends, an adherent type pneumatic cylinder 106 is slid into an adherent type pneumatic cylinder insertion portion 107 for each of the upper element 101 and the lower element 102 so that the upper element 101 and the lower element 102 are combined with each other and fixed. If necessary, an upper element guide pin 230 is provided in the upper element 101 of the high pressure cleaner 60 and a guide pin insertion portion 231 is provided in the lower element 102 so that the upper element guide pin 230 can be inserted into the guide pin insertion portion 231 and the upper element 101 and the lower element 102 can be combined with each other in a correct position. In addition, a heating source or a cooling source 108 is attached to the high pressure cleaner 60 so that the high pressure cleaner 60 can be adjusted at a predetermined temperature or at a temperature in a predetermined range. In this case, as illustrated in FIG. 3, the heating source or the cooling source 108 may have a shape which surrounds the lower element 102 of the high pressure cleaner 60 and into which a heating medium or coolant flows the heating source or the cooling source 108. Coils having a large resistance may be used as the heating source and a variety of modifications is possible.

The inner or outer diameter of the high pressure cleaner 60 may be different according to the diameter of a wafer to be cleaned. The number of adherent type pneumatic cylinders 106 which combine the upper element 101 and the lower element 102 with each other may be different according to the size of the wafer to be cleaned. For example, about 6 to 8 adherent type pneumatic cylinders 106 may be provided for an 8-inch wafer (see cylinder insertion portions 107 in FIGS. 4B and 5B).

As described above, a wafer is loaded in the high pressure cleaner 60 before cleaning, that is, before the upper element 101 and the lower element 102 are combined with each other. The wafer to be cleaned is loaded in a wafer loading device 201 illustrated in FIGS. 6A and 6B. The wafer loading device 201 is fixed when a pin (a protrusion 210) of the wafer loading device 201 is inserted into a wafer loading device fixing portion 210a (see FIG. 4A). In this case, a screw thread is provided in the pin 210 of the wafer loading device 201 and a screw groove is provided in the wafer loading device fixing portion 210a of the upper element 101 so that the wafer loading device 201 can be more securely fixed in the upper element 101. For your reference, a plurality of wafer loading device fixing portions 210a are shown in FIG. 4B. However, for explanatory convenience, only two wafer loading device fixing portions 210a are shown in FIG. 4A.

If necessary, an auxiliary pin 211 is provided in the lower element 102, as illustrated in FIG. 5B, so that a wafer to be inserted into the wafer loading device 201 can be supported by the auxiliary pin 211. Of course, only two auxiliary pins 211, as illustrated in FIG. 5B, need not to be provided and a variety of modifications is possible.

The wafer loading device 201 may be a wafer loading device 201 on which a sheet of wafer is loaded, as illustrated in FIG. 6A or a wafer loading device 201 on which a plurality of wafers are simultaneously loaded, as illustrated in FIG. 7A.

After the wafer is loaded in the wafer loading device 201, high purity (greater than 99.99%) gaseous $CO_2$ having low pressure (less than 20 psig) using pressure regulators 52 and 53 (see FIG. 1 or 2) primarily flows into the high pressure cleaner 60 from the gaseous $CO_2$ supply source 20 (see FIG. 1 or 2) when the upper element 101 descends. As such, fine contaminants inside the high pressure cleaner 60 are removed. When the upper element 101 and the lower element 102 of the high pressure cleaner 60 are engaged with each other, the upper element 101 and the lower element 102 are combined with each other using the adherent type pneumatic cylinder 106.

Then, the high purity gaseous $CO_2$ having high pressure (about 30 to 50 bar) flows into the high pressure cleaner 60, and $CO_2$ having low pressure (for example, pressure lower than supercritical cleaning pressure of 120 to 300 bar by 10 to 40 bar) flows into the high pressure cleaner 60 so that the supercritical homogeneous transparent phase mixture to flow is not deformed. In this case, pressure of the high pressure cleaner 60 is regulated at a predetermined pressure or at a pressure in a predetermined range using the pressure regulating valve 54. Then, the supercritical homogeneous transparent phase mixture flows into the high pressure cleaner 60 so that cleaning can be performed.

At this time, the high pressure cleaner 60 should be completely sealed so that the $CO_2$ of the supercritical homogeneous transparent phase mixture flowing into the high pressure cleaner 60 cannot leak. To this end, the high pressure cleaner 60 may further include a sealant. In FIGS. 6A and 7A, a first sealant 220 and a second sealant 221 are provided. That is, a first bended portion is provided at an edge of a surface of the upper element 101 in a direction of the lower element 102, and a second bended portion is provided at an edge of a surface of the lower element 102 in a direction of the upper element 101. The first sealant 220 and the second sealant 221 are provided in the first bended portion and the second bended portion, respectively. The first sealant 220 and the second sealant 221 may have a variety of shapes. In FIGS. 6A and 7A, the first sealant 220 and the second sealant 221 have a "⌐" shape.

A pressure-resistant energized Teflon seal or a metal seal may be used for the first sealant 220 and the second sealant 221. The energized Teflon seal is formed of pure Teflon or Teflon in which a charging material is mixed. To ensure elasticity required as a restoring force of the first sealant 220 and the second sealant 221, the first sealant 220 and the second sealant 221 may include a cantilever spring or helicoil spring having the same material as that of metal seal. When metal seal is used for the first sealant 220 and the second sealant 221, the first sealant 220 and the second sealant 221 may be formed SUS316-based stainless steel in which corrosion does not occur, Hastelloy-C or Elgiloy depending on the composition of an additive.

Of course, a material for the first sealant 220 and the second sealant 221 is not limited to this and a variety of materials of which anticorrosive property and durability are excellent at a supercritical high pressure and which can be sealed may be used for the first sealant 220 and the second sealant 221.

As described above, high purity (greater than 99.99%) gaseous $CO_2$ having low pressure (less than 20 psig), high purity gaseous $CO_2$ of a high pressure (about 30 to 50 bar), $CO_2$ having low pressure than a supercritical cleaning pressure (for example, pressure lower than the supercritical cleaning pressure of 120 to 300 bar by 10 to 40 bar), and a supercritical homogeneous transparent phase mixture flow into the high pressure cleaner via an inlet 110 provided in the upper element 101 of the high pressure cleaner 60.

The inlet 110 is connected to an upper portion of the wafer loading device 201. A groove 202a is formed in a circumferential direction of the wafer loading device 201, as illustrated in FIG. 6B, and a plurality of spray outlets 202 are provided inside the groove 202a in a direction of the top surface of a wafer to be loaded. The inlet 110 is provided so that a material injected through the inlet 110 is injected in a direction of the groove 202a of the wafer loading device 201. Thus, the material passing through the inlet 110 moves along the groove 202a in the circumferential direction of the wafer loading device 201 and the wafer that passes through the spray outlets 202 is cleaned. That is, the wafer cleaning device 201 divides the supercritical homogeneous transparent phase mixture in the high pressure cleaner 60 and maximizes the cleaning effect. Referring to FIGS. 7A and 7B which illustrates the case where a plurality of wafers are loaded in one wafer loading device 201, the spray outlets 202 are provided in a direction of each wafer to be loaded so that, when the wafers are loaded in the wafer loading device 201, each wafer can be effectively cleaned.

The supercritical homogeneous transparent phase mixture flows into the high pressure cleaner 60 and the homogeneous transparent phase is maintained at a predetermined pressure or temperature, whereby each wafer is cleaned. The supercritical homogeneous transparent phase mixture infiltrates photoresist polymer and expands so that the photoresist polymer is decomposed or dissolved together with the cleaning additive. In this procedure, a photoresist on each wafer or etch residues are substantially removed.

If the photoresist or etch residues on each wafer are removed in this manner, the cleaning mixture is removed using a supercritical rinsing mixture containing the rinsing additive supplied from the cleaning additive supply source 26 and the supercritical $CO_2$. A rinsing additive mixture that may exist on the surface of the wafer is removed using only the supercritical $CO_2$.

The material used in the cleaning and rinsing processes is discharged to the outside via an outlet 111 illustrated in FIGS. 5A and 5B and post-processed as described above and re-used or separately processed. The position and shape of the outlet 111 are not limited to those illustrated in FIGS. 5A and 5B and a variety of modifications is possible. In this case, as illustrated in FIG. 5B, the outlet 111 may be positioned opposite to the position of the outlet 110 illustrated in FIG. 4B. To this end, the supercritical homogeneous transparent mixture or the supercritical rinsing mixture injected through the inlet 110 passes through the inside of the high pressure cleaner 60 and is discharged to the outside so that cleaning and rinsing of the wafer can be effectively performed.

By using the above-described high pressure cleaner 60 and the cleaning process and apparatus described above, the supercritical $CO_2$ and the additive form the supercritical homogeneous transparent phase mixture so that the surface of the wafer injected into the high pressure cleaner 60 can be cleaned. In addition, unlike the prior art, the wet process is not performed so that an excellent cleaning result can be obtained.

In addition, if the supercritical homogeneous transparent phase mixture is formed in the homogeneous transparent phase mixer 70, the mixture is supplied as rapid flow onto the wafer via the spray type wafer loading device 201 such that an excellent cleaning effect can be achieved even in a non-circulating state (see FIG. 1). In addition, cleaning by contact of the circulation flow (see FIG. 2) provides fluidity of the mixture so that a contact effect of the mixture and the wafer is maximized, the dissolved photoresist and photoresist residues are continuously removed and the cleaning effect is further enhanced.

As described above, the cleaning additive and contaminants that remain on the wafer after the cleaning process can be removed by supplying the supercritical rinsing mixture which is a mixture of the supercritical $CO_2$ and the cleaning additive. The rinsing additive that remains after the removing process can be removed by supplying only the supercritical $CO_2$. The supercritical rinsing mixture used in this procedure is conducive to rinsing and auxiliary cleaning so that the cleaning effect is maximized.

Even in the rinsing process, the supercritical homogeneous transparent phase mixture is supplied by a spray type rapid flow like in the cleaning process so that a wafer to be cleaned can be cleaned by contact with only a pump flow (see FIG. 1) or by contact with the pump flow and the circulation flow (see FIG. 2).

The total process time including the cleaning time and the rinsing time may be within 10 minutes.

FIG. 8 is a graph of time versus pressure with respect to all sections of a cleaning process, as described above, using the cleaning apparatus illustrated in FIG. 2. In FIG. 8, $P_C$ is a supercritical pressure and $P_0$ is a desired supercritical cleaning pressure. $P_1$ is greater than $P_C$ and less than about 10 to 40 bar of cleaning pressure $P_o$, that is, $P_2$. $P_1$ is pressure in which the supercritical homogeneous transparent phase mixture formed in the homogeneous transparent phase mixer can be maintained in a homogeneous transparent phase.

As described above, the cleaning process is performed in the state where only the supercritical $CO_2$ is primarily filled in the high pressure cleaner 60 up to pressure $P_1$ and the supercritical homogeneous transparent phase mixture is filled in the high pressure cleaner 60a short time later. The rinsing process can be performed even under a lower pressure than cleaning pressure $P_o$, as shown by the rinsing section of FIG. 8. Of course, the process illustrated in FIG. 8 is an example and the present invention is not limited to this.

[Embodiments 1 to 4]

An experiment for dry cleaning a wafer that had gone through a back-end-of-the-line (BEOL) process using a supercritical homogeneous transparent phase mixture and removing photoresist residues having a rabbit ears shape that remained after aluminium metal etching was carried out.

The wafer had a layer structure of Si/Si rich oxide 4000 Å/Ti 300 Å/TiN 900 Å/Al 8000 Å/Ti 100 Å/TiN 400 Å, and photoresist residues generated in a metal etching process remained on the wafer.

In this case, a cleaning additive mixed with the supercritical $CO_2$ was a formulation of a surfactant, a stripper for semiconductor cleaning or co-solvent mixture, and ethanol. Only ethanol was used as a primary rinsing additive mixed with the supercritical $CO_2$ and only the supercritical $CO_2$ was used without any additive in a secondary rinsing process which is a final process.

The wafer under the above-described conditions was used, and a cleaning experiment was carried out whereby different surfactant or rinsing conditions were used. The conditions were shown in Table 1 below.

TABLE 1

| Classification | Embodiment 1 | Embodiment 2 | Embodiment 3 | Embodiment 4 |
|---|---|---|---|---|
| Composition of Cleaning additive (wt %) | PFOA 83.5<br>Stripper 6.0<br>Ethanol 10.5 | monohydrated-PFOA 87.4<br>Stripper 5.2<br>Ethanol 7.4 | PFHA 83.5<br>Stripper 6.0<br>Ethanol 10.5 | PFOA 82.7<br>MEA 2.5<br>1-M-2-P 1.7<br>Ethanol 13.1 |
| Volume of cleaning additive | 13.6% | 16.2% | 13.6% | 13.6% |
| Primary Rinsing additive | Ethanol | Ethanol | Ethanol | Ethanol |
| Volume of primary rinsing additive | 16.7% | 16.7% | 16.7% | 16.7% |
| Cleaning conditions | 55° C., 148 bar<br>3 min<br>(non-circulating) | 51° C., 165 bar<br>3 min<br>(non-circulating) | 54° C., 163 bar<br>3 min<br>(non-circulating) | 52° C., 160 bar<br>3 min<br>(non-circulating) |
| Primary rinsing conditions | 36° C.<br>132 ± 6 bar<br>2 min (flow) | 45 ± 1° C.<br>153 ± 12 bar<br>2 min (flow) | 42° C.<br>125 ± 3 bar<br>2 min (flow) | 40 ± 1° C.<br>145 ± 5 bar<br>2 min (flow) |
| Secondary rinsing conditions | 39° C.<br>122 ± 7 bar<br>2 min (flow) | 42° C.<br>148 ± 7 bar<br>2 min (flow) | 46° C.<br>121 ± 3 bar<br>2 min (flow) | 40 ± 3° C.,<br>136 ± 6 bar<br>2 min<br>(non-circulating) |

Here, the primary rinsing process is a rinsing process using a supercritical homogeneous transparent phase mixture in which the cleaning additive and the supercritical $CO_2$ are mixed, and the secondary rinsing process is a rinsing process using only the supercritical $CO_2$. PFOA is perfluorooctanoic acid, PFHA is perfluoroheptanoic acid, MEA is monoethanolamine, and 1-M-2-P is 1-methyl-2-pyrrolidinone.

The premise of supercritical fluid cleaning and rinsing is to make and maintain a homogeneous transparent phase mixture in which ingredients of a supercritical fluid mixture are not separated. A photo of the supercritical homogeneous transparent phase mixture formed in the cleaning process is shown in FIG. 9.

Figure 10A:
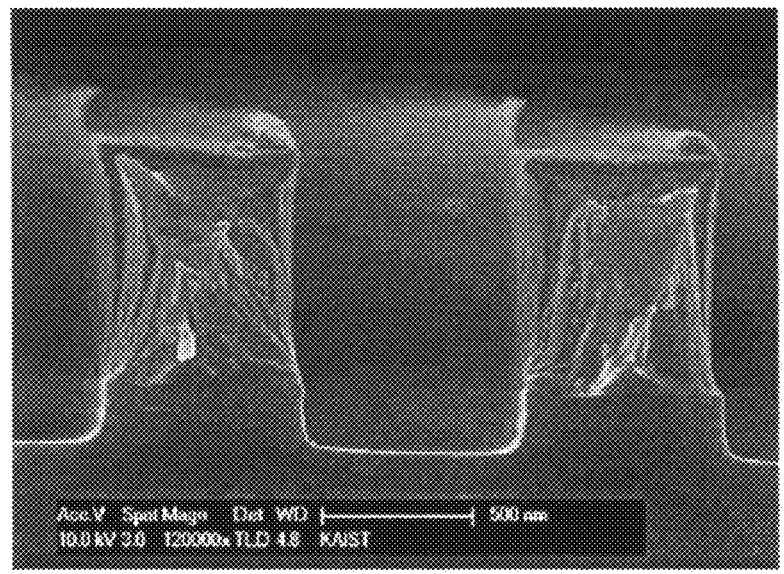
FIG. 10A is a cross-sectional photo showing a wafer that has gone through a back-end-of-the-line (BEOL) process but is not cleaned using a cleaning process according to an embodiment of the present invention.
Figure 10B:
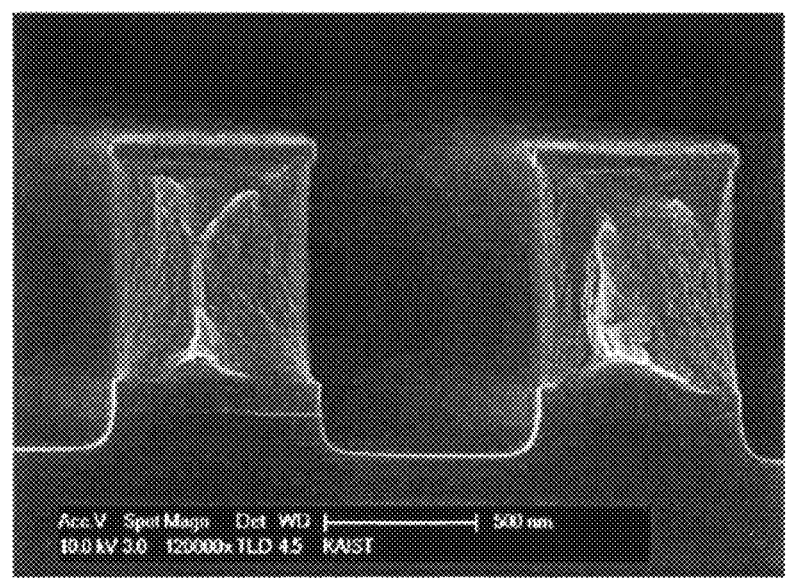
FIGS. 10B through 10E are cross-sectional photos showing the case where the wafer of FIG. 10A has been cleaned using a cleaning process according to an embodiment of the present invention.
Figure 10C:
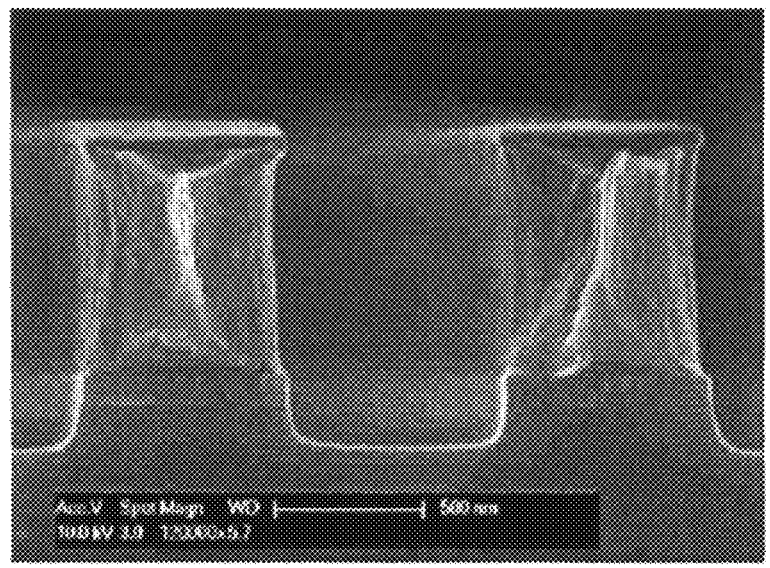
Figure 10D:
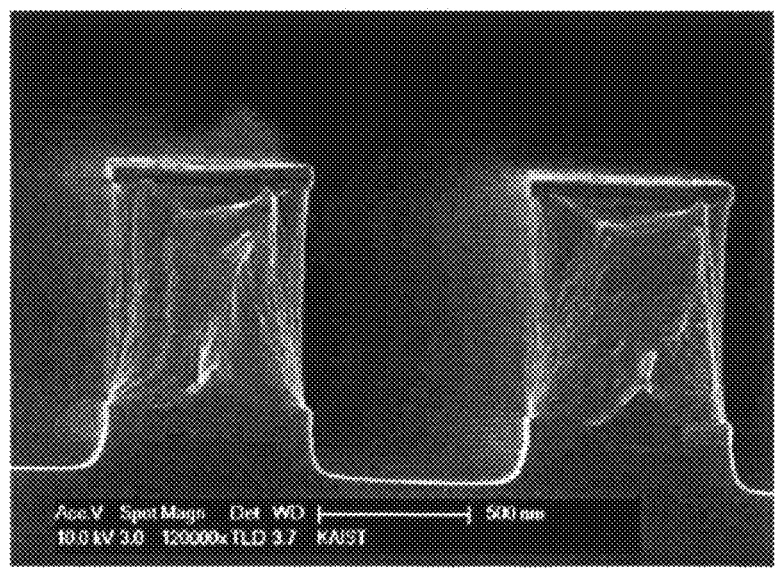
Figure 10E:
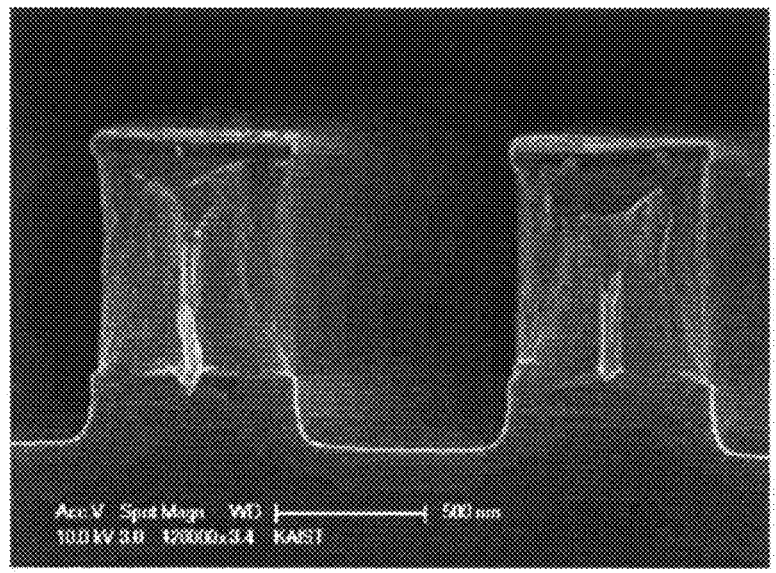

After the rinsing process, the result of observing the state before and after the cleaning process using a scanning electron microscope (SEM) is shown in FIG. 10A (before cleaning), FIG. 10B (Embodiment 1), FIG. 10C (Embodiment 2), FIG. 10D (Embodiment 3), and FIG. 10E (Embodiment 4). Here, FIGS. 10B, 10C, and 10D show the result in which the cleaning process was carried out in the state where a cleaning additive was formulated by using a stripper for semiconductor cleaning and ethanol as a co-solvent and by changing a surfactant, and FIGS. 10B, 10C, and 10D show different results according to a cleaning characteristic based on the composition of the surfactant and the cleaning additive. FIG. 10E shows the case where a stripper for semiconductor cleaning is not used as a co-solvent but is selected and formulated by itself, as illustrated in the above Table 1.

Referring to FIG. 10A, which shows a wafer before the cleaning process, photoresist residues formed of polymer generated in the etching process remain on the surface of the wafer. The photoresist residues are shown in the form of rabbit ears-shaped contamination on the wafer.

FIGS. 10B through 10E are photos showing the case where a wafer has been cleaned using the supercritical homogeneous transparent phase mixture under the conditions of Table 1. As illustrated in FIGS. 10A through 10E, an excellent cleaning effect in which all rabbit ears-shaped photoresist residues are removed within 10 minutes of total process time, is obtained.

[Comparative Examples 1 and 2]

Figure 10F:
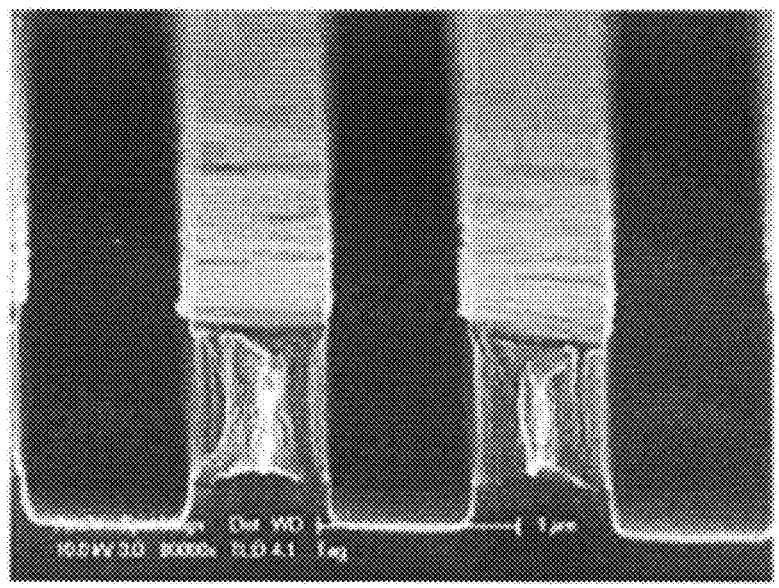
FIG. 10F is a cross-sectional photo showing the case where a wafer has been cleaned using a conventional wet cleaning process.
Figure 10G:
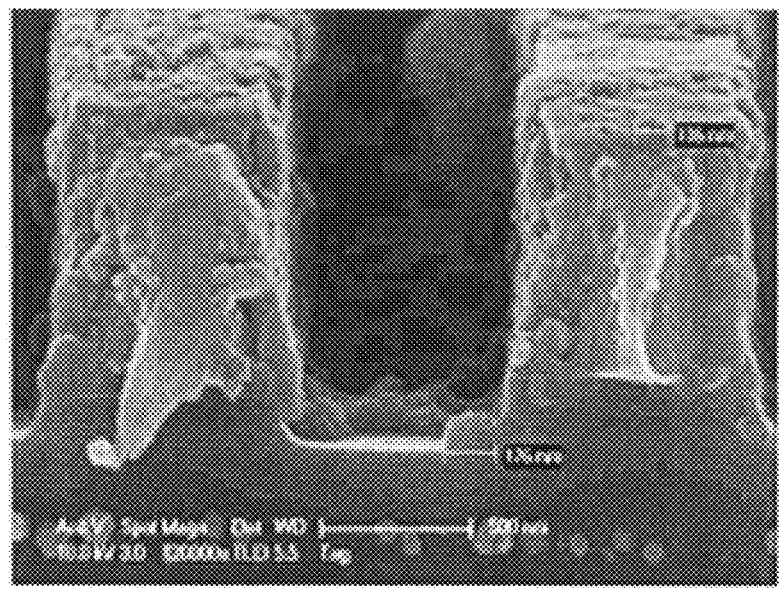
FIG. 10G is a cross-sectional photo showing the case where the wafer of FIG. 10A has been cleaned using a cleaning process that does not satisfy conditions according to an embodiment of the present invention.

FIG. 10F is a cross-sectional photo showing the case where a wafer has been cleaned using a conventional wet cleaning process, and FIG. 10G is a cross-sectional photo showing the case after the wafer of FIG. 10A is cleaned using a cleaning process that does not satisfy conditions according to an embodiment of the present invention.

FIG. 10F shows the case where the conventional wet cleaning process is performed for 120 minutes using the cleaning additive used in Embodiment 1. Even though the wet cleaning is performed for 120 minutes, unlike the cleaning result of Embodiments 1 and 2, photoresist residues having a rabbit ears shape remain. As such, a supercritical dry cleaning process according to the present invention shows an epoch-making cleaning result compared to the conventional wet cleaning process.

FIG. 10G shows the case where a homogeneous transparent phase is not formed using a surfactant or by changing process conditions under the conditions of Embodiments 1 to 4, and cleaning is not satisfactory. Even when a rinsing process according to the present embodiment is not performed, a similar result to FIG. 10G is obtained. As such, it is essential for a dry cleaning process according to the present embodiment to form a homogeneous transparent phase.

[Embodiment 5]

An experiment for removing a photoresist on a wafer during a wafer manufacturing process that had gone through a front-end-of-the-line (FEOL) process using a supercritical homogeneous transparent phase mixture was carried out.

The wafer had a layer structure of Si/HLD 1000 Å/Nitride 4500 Å/BPSG 21000 Å/PR 10500 Å. The wafer, which was a p-type wafer on which a positive photoresist was coated, was heat-treated at 120° C.

Just ethanol was used for the cleaning additive mixed in the supercritical $CO_2$ according to an embodiment of the present invention, and a rinsing process was performed once only using supercritical $CO_2$.

Cleaning conditions are Table 2 below.

TABLE 2

| Cleaning additive | Ethanol |
|---|---|
| Volume of cleaning additive (%) | 13.6% |
| Cleaning conditions | 58° C., 150 bar, 2 min (non-circulating) |
| Rinsing conditions | 48 ± 1° C., 142 ± 6 bar, 2 min (flow) |

Figure 11A:
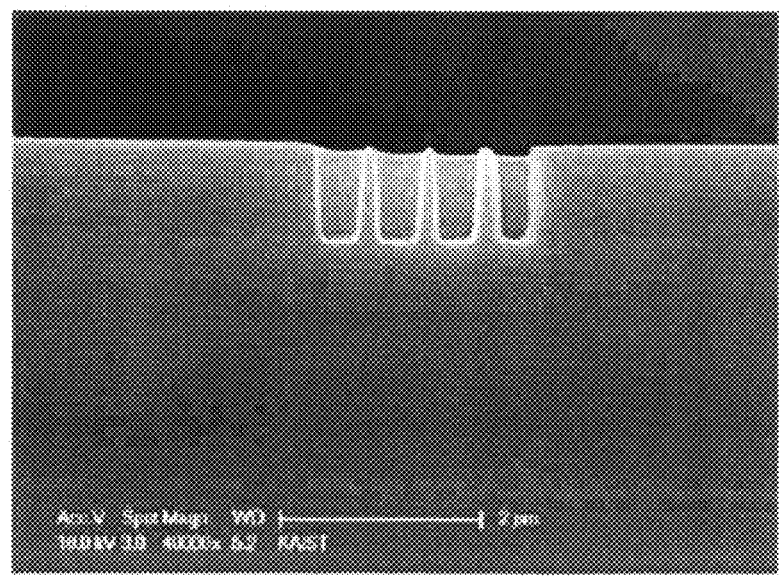
FIG. 11A is a cross-sectional photo showing a wafer that has gone through a front-end-of-the-line (FEOL) process but is not cleaned using the cleaning process according to an embodiment of the present invention.
Figure 11B:
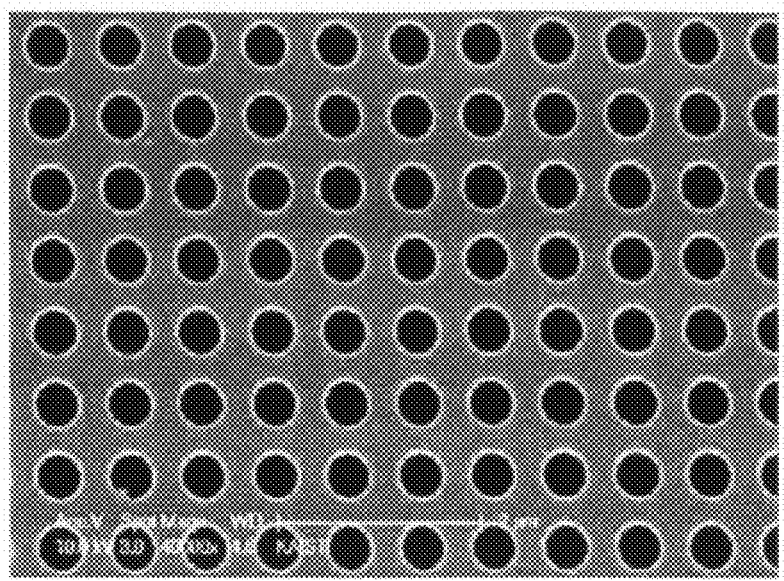
FIG. 11B is a photo of the surface of the wafer illustrated in FIG. 11A.

FIG. 11A is a cross-sectional photo of a wafer that has gone through an FEOL process but is not cleaned using the cleaning process according to an embodiment of the present invention, and FIG. 11B is a photo of the surface of the wafer illustrated in FIG. 11A. Referring to FIG. 11A, a photoresist layer is formed on the wafer, and a groove is formed in the photoresist layer. When viewing FIG. 11A, protrusions formed of a photoresist having a circular cross-section are formed on the wafer as illustrated in FIG. 11B.

Figure 11C:
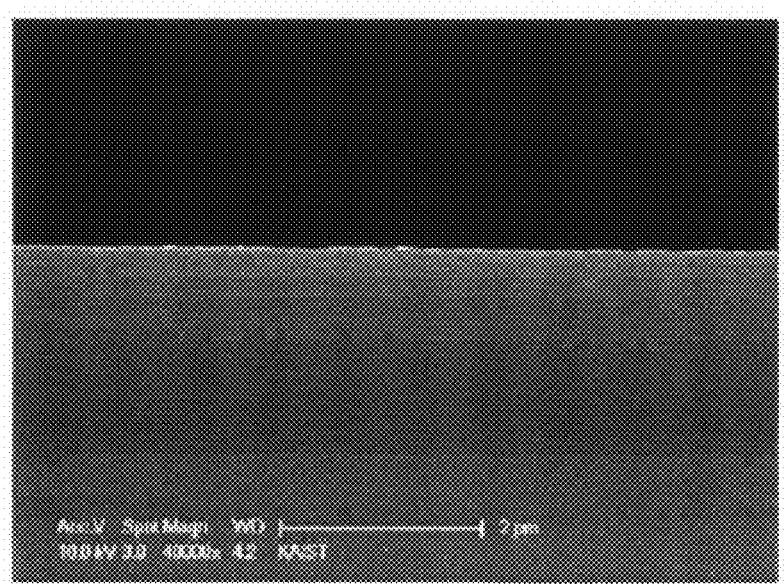
FIG. 11C is a cross-sectional photo showing the case where the wafer of FIGS. 11A and 11B has been cleaned using the cleaning process according to an embodiment of the present invention.
Figure 11D:
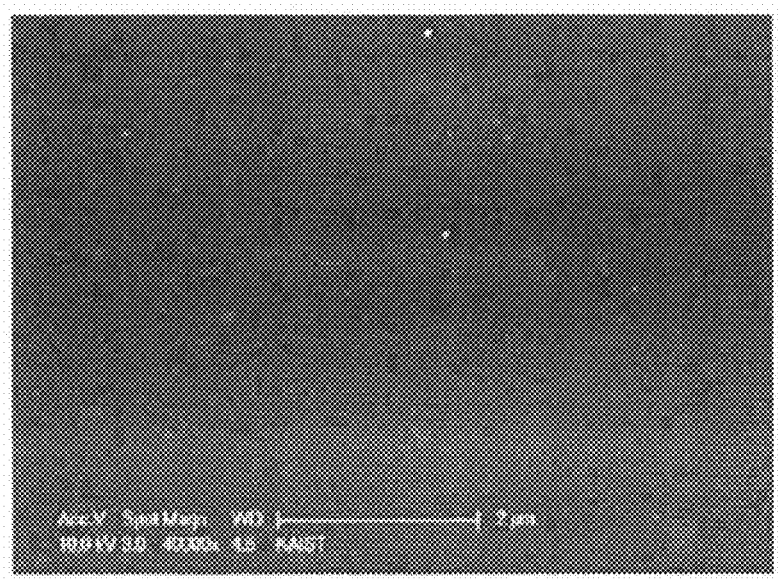
FIG. 11D is a photo of the surface of the wafer illustrated in FIG. 11C.

FIG. 11C is a cross-sectional photo of the case where the wafer of FIGS. 11A and 11B has been cleaned using the cleaning process according to an embodiment of the present invention, and FIG. 11D is a photo of the surface of the wafer illustrated in FIG. 11C. Referring to FIG. 11C, a photoresist layer is completely removed, unlike FIG. 11A, and this can be seen in FIG. 11D.

[Embodiments 6 and 7]

An experiment for cleaning a wafer that has gone through a post ion implantation process using a supercritical homogeneous transparent phase mixture and for removing a photoresist or photoresist residues that remain on an ion-implanted wafer during an arsenic (As) ion implantation process was carried out. The wafer has a variety of patterns including, in this case, numbers.

The wafer had a layer structure of Si/Oxide 5000 Å/Poly 2000 Å/PR 50000 Å. An As ion implantation energy was 60 KeV, and the wafer doped with ions of 5E13/cm that has gone through a post ion implantation process was used.

The cleaning additive mixed with the supercritical $CO_2$ was formulation of a surfactant, a stripper for semiconductor cleaning or co-solvent mixture, and ethanol. Only ethanol was used as a primary rinsing additive mixed with the supercritical $CO_2$ and only the supercritical $CO_2$ was used without any additive in a secondary rinsing process which is a final process.

The cleaning process was performed so that a supercritical homogeneous transparent phase mixture (FIG. 9) was formed and maintained, like in the cleaning process (Embodiments 1 to 4) of the wafer that went through a BEOL process. The conditions were shown in Table 3 below.

TABLE 3

| Classification | Embodiment 6 | Embodiment 7 |
|---|---|---|
| Composition of cleaning additive (wt %) | PFOA 83.5<br>Stripper 6.0<br>Ethanol 10.5 | PFOA 83.8<br>Stripper 7.1<br>Ethanol 9.1 |
| Volume of cleaning additive (%) | 13.6% | 17.5% |
| Primary rinsing additive | Ethanol | Ethanol |
| Volume of primary rinsing additive (%) | 16.7% | 16.7% |
| Cleaning conditions | 59° C.<br>148 bar<br>3 min<br>(non-circulating) | 50° C.<br>150 bar<br>3 min<br>(non-circulating) |
| Primary rinsing conditions | 43 ± 3° C.<br>125 ± 5 bar<br>2 min (flow) | 42° C.<br>150 ± 3 bar<br>2 min (flow) |
| Secondary rinsing conditions | 48 ± 3° C.<br>122 ± 1 bar<br>2 min (flow) | 40° C.<br>150 ± 5 bar<br>2 min (flow) |

Figure 12A:
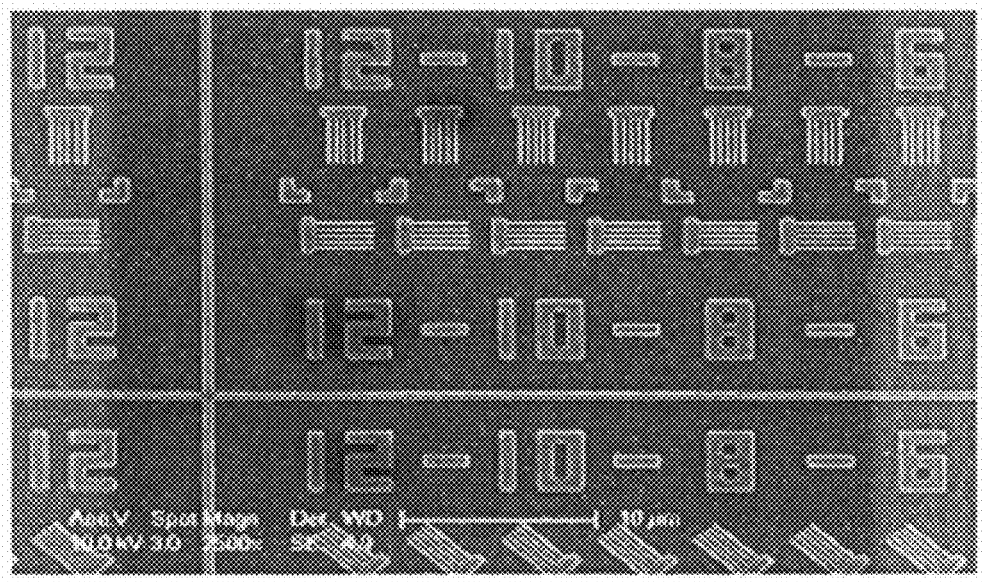
FIG. 12A is a photo of the surface of a wafer that has gone through a post ion implantation process but is not cleaned using a cleaning process according to an embodiment of the present invention.

FIG. 12A is a photo of the surface of a wafer that has gone through a post ion implantation process but is not cleaned using a cleaning process according to an embodiment of the present invention. Photoresist residues (opaque white dots) remain and protrude from the wafer having a variety of patterns including numbers.

Figure 12B:
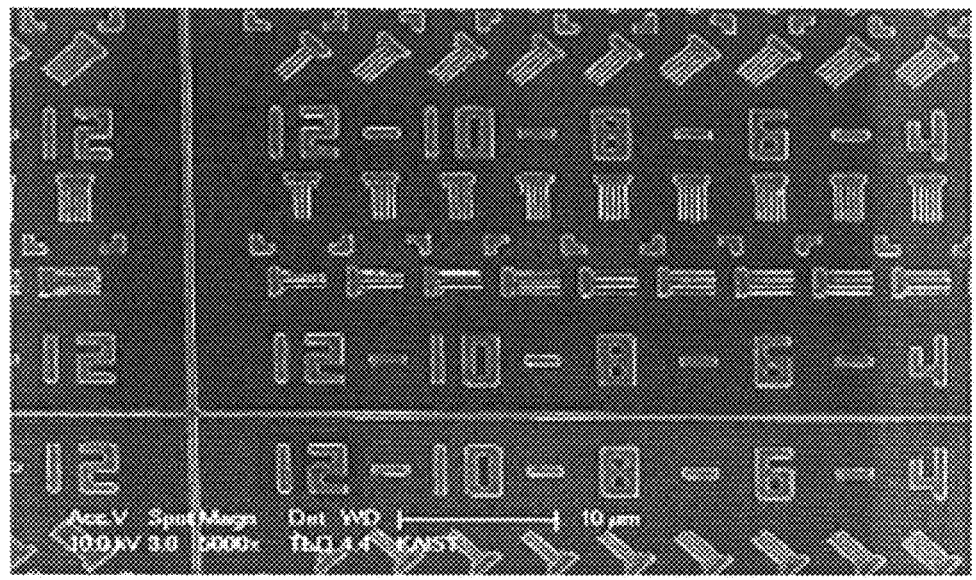
FIGS. 12B and 12C are photos of the surface of the wafer of FIG. 12A that has been cleaned using a cleaning process according to an embodiment of the present invention.
Figure 12C:
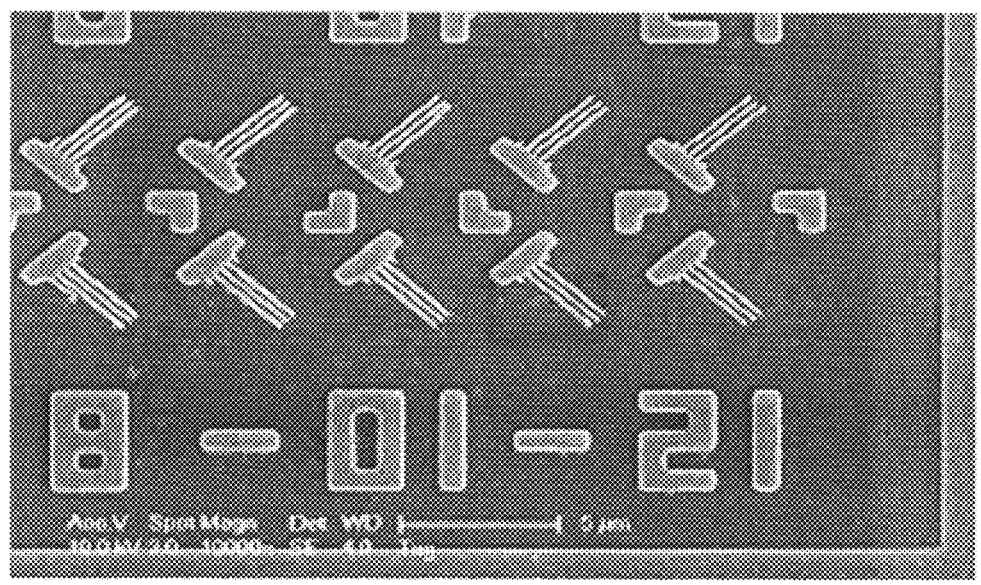

FIGS. 12B and 12C are photos of the surface of the wafer of FIG. 12A that has been cleaned using a cleaning process according to an embodiment of the present invention. Photoresist residues can be safely removed.

The cleaning additive including a fluoride group surfactant used in the above-described embodiments may be used as the cleaning additive in the above-described cleaning process. The fluoride group surfactant may use fluoride group carboxylic acid having a carbon number 2 to 20, perfluoro ether system polymer having an average molecular weight of 300 to 5000 or a mixture thereof.

In addition, like in the above-described embodiments, the cleaning additive may include fluorosurfactant 0.01 to 90 wt %, aliphatic amine 0.01 to 15 wt %, polar organic solvent 0.01 to 15 wt %, alcohol-based solvent 0.1 to 20 wt %, ether-based solvent 0.1 to 30 wt %, anticorrosive agent 0 to 5 wt %, and water 0 to 15 wt %. Here, 0 wt % means that a corresponding element is not included in the cleaning additive, which is also applied to a later description.

In this case, fluorosurfactant may be fluoride group carboxylic acid having a carbon number of 2 to 20, perfluoro ether system polymer having an average molecular weight of 300 to 5000 or a mixture thereof. The aliphatic amine is monoethanolamine, 2-(2-aminoethoxy)ethanol, diethanolamine, amino bis propylamine, 2-methylaminoethanol, triethylaminoethanol or a mixture thereof. The polar organic solvent is N,N'-dimethylacetamide, dimethylsulfuroxide, 1-methyl-2-pyrrolidinone, N,N'-dimethylformamide, ammonium fluoride or a mixture thereof. The alcohol-based solvent is methanol, ethanol, isopropanol or a mixture thereof. The ether-based solvent is ethyleneglycol methylether, ethyleneglycol ethylether, ethyleneglycol butylether, diethyleneglycol methylether, diethylenglycol ethylether, triethyleneglycol methylether, triethyleneglycol ethylether or a mixture thereof. The anticorrosive agent is catechol, gallic acid or a mixture thereof.

Like in the above-described embodiments, the cleaning additive may include fluorosurfactant 0 to 90 wt %, semiconductor cleaning stripper 0.1 to 15 wt %, alcohol-based solvent 0.1 to 20 wt %, and water 0 to 15 wt %. In this case, the fluorosurfactant is fluoride group carboxylic acid having a carbon number of 2 to 20, perfluoro ether system polymer having an average molecular weight of 300 to 5000 or a mixture thereof. The alcohol-based solvent is methanol, ethanol, isopropanol or a mixture thereof.

Only the alcohol-based solvent may be used as the cleaning additive, and like in the above-described embodiments, only the supercritical $CO_2$ may be used in the process of rinsing the wafer, and the alcohol-based solvent may be methanol, ethanol, isopropanol or a mixture thereof.

In the supercritical homogeneous transparent phase mixture in which the supercritical $CO_2$ and the cleaning additive used in the above embodiments are mixed, the cleaning additive was less than 30 percent by volume. In addition, in the supercritical homogeneous transparent phase mixture in which the supercritical $CO_2$ and the cleaning additive used in the above embodiments are mixed, the rinsing additive was less than 30 percent by volume. In this case, the rinsing additive included methanol, ethanol, isopropanol or a mixture thereof.

As described above, in the cleaning apparatus and the high pressure cleaner thereof according to the present invention, the cleaning process can be simplified, a time required for the cleaning process can be reduced and an excellent cleaning effect can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A cleaning apparatus comprising:
   a liquid carbon dioxide ($CO_2$) supply source and a gaseous $CO_2$ supply source;
   a high pressure pump changing $CO_2$ supplied from the liquid $CO_2$ supply source to $CO_2$ having high pressure;
   a cleaning additive supply source and a rinsing additive supply source;
   a homogeneous transparent phase mixer forming a supercritical homogeneous transparent phase mixture by mixing a cleaning additive supplied from the cleaning additive supply source and supercritical $CO_2$ supplied from the liquid $CO_2$ supply source, or forming a supercritical rinsing mixture by mixing a rinsing additive supplied from the rinsing additive supply source and supercritical $CO_2$ supplied from the liquid $CO_2$ supply source;
   a high pressure cleaner cleaning using the supercritical homogeneous transparent phase mixture supplied from the homogeneous transparent phase mixer and performing rinsing using the supercritical rinsing mixture supplied from the homogeneous transparent phase mixer;
   a separator separating gaseous $CO_2$ from a mixture discharged from the high pressure cleaner; and
   a $CO_2$ condenser condensing the separated $CO_2$;
   wherein the homogeneous transparent phase mixer comprises a high pressure vessel, the vessel being separate from the cleaning additive supply source, the rinsing additive supply source, and the high pressure cleaner.

2. The cleaning apparatus of claim 1, further comprising at least one of a cleaning column and an adsorption column for purifying $CO_2$ separated by the separator.

3. The cleaning apparatus of claim 1, wherein $CO_2$ condensed in the $CO_2$ condenser is provided to the liquid $CO_2$ supply source and is re-used.

4. The cleaning apparatus of claim 1, further comprising a heater heating $CO_2$ supplied from the liquid $CO_2$ supply source, the cleaning additive supplied from the cleaning additive supply source, and the rinsing additive supplied from the rinsing additive supply source.

5. The cleaning apparatus of claim 1, wherein the homogeneous transparent phase mixer forms the supercritical homogeneous transparent phase mixture by mixing the cleaning additive supplied having atmospheric pressure or a low pressure less than 10 bar with the supercritical $CO_2$ having high pressure of 120 to 300 bar, using a large pressure difference therebetween.

6. The cleaning apparatus of claim 1, further comprising a pressure regulating valve connected to the high pressure cleaner and regulating pressure inside the high pressure cleaner.

7. The cleaning apparatus of claim 1, further comprising:
   a circulation line connecting an outlet of the high pressure cleaner to a middle point between the high pressure cleaner and the homogeneous transparent phase mixer; and
   a circulation pump connected to the circulation line.

8. The cleaning apparatus of claim 1, wherein an internal or external circulation unit is provided to the homogeneous transparent phase mixer.

9. The cleaning apparatus of claim 1, wherein the homogeneous transparent phase mixer separately comprises a first homogeneous transparent phase mixer forming the supercritical homogeneous transparent phase mixture by mixing the cleaning additive supplied from the cleaning additive supply source and supercritical $CO_2$ supplied from the liquid $CO_2$ supply source and a second homogeneous transparent phase mixer forming the supercritical rinsing mixture by mixing a rinsing additive supplied from the rinsing additive supply source and supercritical $CO_2$ supplied from the liquid $CO_2$ supply source.

* * * * *